（12）United States Patent
Edlinger et al.

(10) Patent No.: US 10,327,325 B2
(45) Date of Patent: Jun. 18, 2019

(54) PRINTED CIRCUIT BOARD AND METHOD FOR PRODUCING A PRINTED CIRCUIT BOARD

(71) Applicant: ZKW GROUP GMBH, Wieselburg (AT)

(72) Inventors: Erik Edlinger, Vienna (AT); Dietmar Kieslinger, Theresienfeld (AT)

(73) Assignee: ZK W Group GmbH, Wieselburg (AT)

( * ) Notice: Subject to any disclaimer, the term of this patent is extended or adjusted under 35 U.S.C. 154(b) by 0 days.

(21) Appl. No.: 15/741,585

(22) PCT Filed: Jun. 21, 2016

(86) PCT No.: PCT/AT2016/050215
§ 371 (c)(1),
(2) Date: Jan. 3, 2018

(87) PCT Pub. No.: WO2017/004632
PCT Pub. Date: Jan. 12, 2017

(65) Prior Publication Data
US 2018/0199425 A1    Jul. 12, 2018

(30) Foreign Application Priority Data
Jul. 6, 2015    (AT) .............................. A 50581/2015

(51) Int. Cl.
*H05K 1/02* (2006.01)
*H05K 3/40* (2006.01)
(Continued)

(52) U.S. Cl.
CPC ......... *H05K 1/0204* (2013.01); *H05K 1/0206* (2013.01); *H05K 1/111* (2013.01);
(Continued)

(58) Field of Classification Search
CPC .. H05K 1/0204; H05K 3/4038; H05K 3/4046; H05K 3/4053; H05K 3/4076; H05K 3/4084; H05K 1/115; H05K 1/116
See application file for complete search history.

(56) References Cited

U.S. PATENT DOCUMENTS 5,019,941 A    5/1991  Craft
5,506,755 A    4/1996  Miyagi et al.
(Continued)

FOREIGN PATENT DOCUMENTS

DE    102009060123 A1    6/2011
EP      1962566 A2        8/2008
GB      2304999 A          3/1997

OTHER PUBLICATIONS

Office Action issued in Austrian Application No. A 50581/2015, dated May 4, 2016 (3 pages).
(Continued)

*Primary Examiner* — Jeremy C Norris
(74) *Attorney, Agent, or Firm* — Eversheds Sutherland (US) LLP

(57) ABSTRACT

A printed circuit board (1) comprising an insulating layer (2) and a conducting layer (3) arranged on the insulating layer (2) and structured into a contact surface (4) for an electronic component (11) which is to be populated on the printed circuit board (1) has, in the area of the contact surface (4), at least one channel (8) that passes through the contact surface (4) and the insulating layer (2) and that is filled with a thermally conductive material. The process is characterized by the steps of preparing an insulating layer (2) and a conducting layer (3) connected with the insulating layer (2); producing at least one channel (8) passing through the conducting layer (2) and the insulating layer (3); lining the channel (8) with thermally conductive material; structuring the conducting layer (3) into a contact surface (4) for an (Continued)

electronic component (11) to be populated on the printed circuit board; preparing a solder deposit (9) at least minimally overlapping with the contact surface (4); setting down the electronic component (11); melting the solder, and cooling.

22 Claims, 4 Drawing Sheets

(51) Int. Cl.
*H05K 1/11* (2006.01)
*H05K 1/18* (2006.01)
*H05K 3/10* (2006.01)
*H05K 3/18* (2006.01)
*H01L 33/64* (2010.01)
*H01S 5/024* (2006.01)

(52) U.S. Cl.
CPC .............. *H05K 1/113* (2013.01); *H05K 1/181* (2013.01); *H05K 3/107* (2013.01); *H05K 3/188* (2013.01); *H01L 33/647* (2013.01); *H01L 2224/16225* (2013.01); *H01S 5/02469* (2013.01); *H05K 1/0272* (2013.01); *H05K 2201/0305* (2013.01); *H05K 2201/09418* (2013.01); *H05K 2201/09572* (2013.01); *H05K 2201/09781* (2013.01); *H05K 2201/10106* (2013.01); *H05K 2201/10121* (2013.01); *H05K 2201/10174* (2013.01); *H05K 2203/042* (2013.01); *H05K 2203/045* (2013.01); *H05K 2203/046* (2013.01); *H05K 2203/0455* (2013.01); *H05K 2203/0723* (2013.01); *H05K 2203/128* (2013.01)

(56) References Cited

U.S. PATENT DOCUMENTS

| 6,190,941 | B1 | 2/2001 | Heinz et al. |
| 6,212,071 | B1 | 4/2001 | Roessler et al. |
| 8,166,650 | B2 * | 5/2012 | Thomas ............... H05K 1/0206 228/180.22 |
| 8,908,383 | B1 | 12/2014 | Railkar et al. |
| 2004/0125578 | A1 | 7/2004 | Konishi et al. |

OTHER PUBLICATIONS

International Search Report and Written Opinion for PCT/AT2016/050215, dated Oct. 21, 2016 (11 pages).

* cited by examiner

PRINTED CIRCUIT BOARD AND METHOD FOR PRODUCING A PRINTED CIRCUIT BOARD

The invention relates to a printed circuit board comprising at least an insulating layer and a conducting layer arranged on the insulating layer and structured into a contact surface for an electronic component which is to be populated on the printed circuit board, and a production process for a printed circuit board.

In the prior art, printed circuit boards, also known as printed wiring boards, serve to connect together electrical components, however above all electronic components, in a space-saving and stable manner. To accomplish this, printed circuit boards have, arranged on insulating layers, conducting layers that are structured into conductor tracks to interconnect the components and that are separated from one another by the insulating layers. The components can be arranged on the surface of the printed circuit board or embedded in the printed circuit board. The progressive miniaturization of printed circuit boards to provide a large number of functionalities in compact devices leads to significant constraints with respect to the dissipation of heat that is given off by the components and that must be efficiently conducted and radiated away, both for protection of the components and also for protection of the printed circuit board. Special problems are presented by components that give off especially large amounts of heat, so power transistors and LEDs (light-emitting diodes), for example, which are increasingly being used in vehicle construction, require carefully thought out heat management of the printed circuit board to avoid overheating and thus the accompanying damage to the printed circuit boards.

In connection with this, it is known in the prior art to provide heat spreading surfaces in the immediate vicinity of electronic components. Heat spreading surfaces are copper layers or also small metal plates that are suitable to absorb the heat emitted from the component and radiate it away over a larger area than that of the component. However, such structures have the disadvantage that they require a relatively large amount of space, which is no longer available for arranging conductor tracks, due to the conducting nature of the heat spreading surfaces.

Therefore, the invention has the goal of indicating a printed circuit board that has improved heat management.

To accomplish this, the inventive printed circuit board of the type mentioned at the beginning is characterized in that the printed circuit board has, in the area of the contact surface (that is, within the area over which the contact surface extends), at least one channel that passes through the contact surface and the insulating layer and that is filled with a thermally conductive material. In the context of this invention, a channel should be understood to be an opening in the printed circuit board that has, in contrast to a simple drill hole or a shaft, a substantial horizontal extension in the plane of the printed circuit board. Therefore, such a channel has similarities with an elongated hole, and the horizontal extension of the channel serves, on the one hand, to provide the largest possible mass of metal to absorb heat given off by the component and, on the other hand, to conduct the heat away from the component horizontally, in the plane of the printed circuit board, so that the heat can be radiated away in a region of the printed circuit board that is distant from the component.

The fact that the inventive channel passes through the contact surface and the insulating layer of the printed circuit board, and that it is filled with a thermally conductive material which is, as a rule a metal, allows the component's heat to be conducted away from the component not only horizontally, i.e., in the plane of the printed circuit board, but rather it is simultaneously conducted to the other side of the insulating layer, where it can additionally be radiated. Unlike simple vias, the inventive channels in the printed circuit board can be dimensioned according to the actual or expected quantities of heat given off by the component, so that it is possible to tailor the heat management to the respective printed circuit board.

According to a preferred embodiment, the inventive printed circuit board is further developed so that the printed circuit board has, in the area of the contact surface, multiple channels passing through the contact surface and the insulating layer, these channels being filled with a thermally conductive material. Although it can be sufficient, according to this invention, to provide only one channel as described above, it is preferred, in order to increase the efficiency of heat dissipation from the component while simultaneously making best possible use of the space available on a printed circuit board, for a contact surface to have multiple channels, which allows the largest mass of metal per contact surface that is possible under the circumstances to be put into the printed circuit board, without making the channel so voluminous that it disrupts the continuous structure of the printed circuit board's insulating layer; the insulating layer substantially contributes to the printed circuit board's mechanical stability, so disrupting its continuity weakens the printed circuit board. Providing multiple channels per contact surface simultaneously distributes the heat more uniformly on the printed circuit board, which in turn counteracts the formation of temperature peaks, and thus the accompanying stresses and consequently weakening of the printed circuit board.

As was already mentioned, an advantage of the invention is that a channel as described and defined above passes through the contact surface and the insulating layer of the inventive printed circuit board, so that the heat can also be radiated away on the side opposite the component. In this connection, it is preferable if the contact surface goes along the channels, from one side of the insulating layer to its other side opposite the first side. This means that the contact surface for the component is not only arranged on the side of the component that also carries the heat-releasing component, but rather that the contact surface is, for example, symmetric on both sides of the printed circuit board, or is on both sides of the printed circuit board's insulating layer, so that the heat is not only carried through the at least one channel to the other side of the printed circuit board, but rather can also be distributed in a planar manner there, according to the dimensioning of the contact surface and, accordingly, efficiently radiated away.

Most electrical and electronic components make contact with multiple contact surfaces, for example two or three, of one and the same conducting layer, so that in connection with this invention it appears advantageous for the conducting layer to be structured into multiple contact surfaces for an electronic component that is to be populated on the printed circuit board and for at least one of the multiple contact surfaces to have at least one channel passing through the contact surface and the insulating layer. Therefore, the arrangement of channels passing through the contact surface and the insulating layer, an arrangement which so far has been described for only one contact surface, can also be applied to multiple contact surfaces for one and the same component, but also for multiple contact surfaces for different components, which in turn is beneficial for dissipating heat from the respective component.

A further improvement in the heat radiation of the component is achieved when the contact surface is in the form of a heat spreading surface. This means that the contact surface for the component to be populated has a surface that substantially exceeds that actually necessary for the component to make contact, so that the dimensioning of the contact surface not only electrically connects the component, but rather the substantially larger design also allows horizontal distribution of the heat given off by the component.

According to a preferred embodiment of this invention, it can be provided that the at least one channel extends beyond the area of the contact surface (that is, the area along which the contact surface extends). Now whether the contact surface is dimensioned as a simple contact surface and therefore essentially with the area that corresponds to the contacts of the component to be populated, or whether the contact surface is designed in the form of a heat spreading surface, i.e., with an area that is substantially larger than what would be necessary for the component to be populated or make contact, in both cases the above-described inventive channels can be dimensioned so that, in particular they can have such a horizontal extension, i.e., such an extension in the plane of the printed circuit board, so that the channel extends beyond the area of the contact surface or the heat spreading surface, and therefore the heat of the component can be conducted as far away from the component as is desired, as long as the channel which is, as a rule filled with metal, as was mentioned above, does not cross any conductor tracks, and above all does not cause any undesired short circuits of any conductor tracks in the printed circuit board.

A series of materials, in particular metals, are possible for filling the channel passing through the contact surface and the insulating layer. A high thermal conductivity can be assumed for copper, silver, and gold, and it is possible for copper to be electroplated. However, a preferred embodiment of this invention provides that the thermally conductive material be selected from the group consisting of a solder, in particular a SAC solder, silver nanopaste, thermal adhesive, and thermal interface material. Filling the channel passing through the contact surface and the insulating layer with a solder is advantageous since in this case populating the component on the printed circuit board, which is, as a rule, done by soldering, can be done in a common process step with filling the at least one channel. SAC solder, which is a solder containing the components tin, silver, and copper, has turned out to be especially advantageous for soldering and simultaneously is especially thermally conductive. The mentioned silver nanopaste is available under the name "Inkron Die Attach Material IDA-22", and is characterized by high thermal conductivity. The silver nanopaste can be applied by means of jet dispensing or stencil printing. A commercially available thermal interface material has become known under the trade names "DOW Corning® TC-4025 Dispensable Thermal Pad", for example or "Tpcm® 200sp".

Up to now, the invention has been described in terms of the minimum requirement of a printed circuit board that should fall under the scope of protection of the printed circuit board defined in the claims. However the invention can also be realized with multilayer printed circuit boards, so that the inventive printed circuit board preferably comprises multiple insulating layers and conducting layers. In this case, the insulating and conducting layers described and defined up to now can be made into contact surfaces and channels which pass through the contact surfaces and the insulating layers and are filled with a thermally conductive material. However, the insulating layers and the conducting layers can also be layers which correspond to the conventional structure of a printed circuit board and generally serve to interconnect electronic components. Therefore, the inventive arrangement of at least one channel that passes through a contact surface and an insulating layer, can be used in combination with multilayer printed circuit boards. That is, the channel can pass through the entire multilayer printed circuit board, or it can end at an interlayer, in particular at a thermally conductive layer, that is perpendicular to the surface of the printed circuit board.

A preferred embodiment provides that the at least one channel be closed or covered with an insulating layer on one side of the printed circuit board, in which case the inventive channel can also be described as a trench.

In addition, it can be provided that the channel be lined with thermally conductive material, in particular its lateral face can be coated with a metallic material, preferably with copper. The lining is provided at least on the channel wall. Lining the channel with a thermally conductive material such as, for example, copper allows capillary forces to act on a solder deposit arranged above the channel, so that after the latter melts it is at least partly taken up into the channel, and fills it. Moreover, this coating clearly improves the solder's connection with the printed circuit board.

In particular, it can be provided that solder resist be applied to the printed circuit board, the at least one contact surface comprising a contact zone that serves to contact the electronic component, the at least one channel and the contact zone being left free (that is, free of solder resist).

This invention serves above all to dissipate heat that is given off by electronic components, but also electrical components on a printed circuit board, for which reason this invention is preferably further developed so that the printed circuit board is populated with an electronic component, especially an LED, a laser diode, and/or an SMD component. Especially in vehicle construction, powerful headlight units are increasingly built using LEDs, which give off extremely large quantities of heat, efficient dissipation of which is essential for protection of the printed circuit board. The same goes for laser diodes, which are also becoming increasingly significant as lamps for vehicle headlights. This invention can make an excellent contribution here, and therefore its use can provide the largest possible benefit.

The inventive production process for a printed circuit board, as just defined, is characterized by the following steps:
 Preparing an insulating layer and a conducting layer connected with the insulating layer;
 Producing at least one channel passing through the conducting and insulating layers;
 Lining the channel with a thermally conductive material;
 Structuring the conducting layer into a contact surface for an electronic component to be populated on the printed circuit board;
 Providing a solder deposit at least minimally overlapping with the contact surfaces;
 Setting down the electronic component;
 Melting the solder and cooling.

An insulating layer with a conducting layer lying above it is prepared using methods that are very well known to the person skilled in the art of producing printed circuit boards. These include laminating processes. Subsequently, the conducting and insulating layers can be processed with any usable method to produce at least one channel passing through these layers. In particular, these methods include drilling and milling and laser cutting processes. Then, the channel is lined with a thermally conductive material, for example the lateral face possibly the bottom surface of the channel are metal-coated by electroplating with Cu. In this processing state, the conducting layer on the top is structured into a contact surface for an electronic component to be populated on the printed circuit board. This is accomplished using, for example, photolithographic processes, such as are usual for producing conductor tracks and contact surfaces. Then, a solder deposit, i.e., an exactly calculated quantity of solid solder, is arranged so that it at least minimally overlaps with the contact surface(s) that is or are provided for the contacting of the component, and the electronic component is arranged in the area over the contact surface, it being possible for the electronic component to rest on the solder deposit. The solder deposit contains paste-like components, which can be printed on, and possibly additionally contains solid components such as solder blocks, which can be fitted on. An only partial overlap of the solder deposit with the contact surfaces is advantageous in that excess flux can escape in the areas in which there is no wetting, without disturbing the flow of solder into the desired areas. The solder is melted by increasing the temperature in the area surrounding the component, which causes the solder deposit to penetrate into the area of the at least one channel by capillary action and by gravity, while simultaneously causing outgassing of flux that might have been applied in the area of the channels and the contact surfaces, and if the quantity of solder is appropriately calculated, simultaneously fills the at least one channel and makes contact with the component.

According to a preferred embodiment of this invention, the step of preparing a solder deposit is preceded application of a solder resist, leaving areas of the contact surface that serve for contact of the electronic component free of the solder resist. This optional step serves to allow the later melted solder that arises in a subsequent step to penetrate only into those areas that are not covered with the solder resist, to avoid an undesired distribution of solder. To accomplish this, the solder resist can be applied so as to omit a corresponding area a priori, or the solder resist can be applied over the entire surface and then removed from the area. The areas that are free of the solder resist also comprise the channels.

According to a preferred embodiment of the inventive process, the step of preparing a solder deposit is preceded by filling the at least one channel with a thermally conductive material, in particular a thermally conductive material selected from the group consisting of a solder, especially SAC solder, silver nanopaste, thermal adhesive, and thermal interface material. In this case, the filling of the channels and the soldering of the component are not simultaneous, however it allows greater design freedom with respect to the filling material for the channels.

As was already mentioned in connection with the inventive printed circuit board, it is preferable to produce multiple channels passing through the contact surface and the insulating layer, to achieve a corresponding improvement in the dissipation of heat given off by the component. Although it can be sufficient, according to this invention, to provide only one channel as described above, it is preferred, in order to increase the efficiency of heat dissipation from the component while simultaneously making best possible use of the space available on a printed circuit board, for a contact surface to have multiple channels, which allows the largest mass of metal per contact surface that is possible under the circumstances to be put into the printed circuit board, without making the channel so voluminous that it disrupts the continuous structure of the printed circuit board's insulating layer; the insulating layer substantially contributes to the printed circuit board's mechanical stability, so disrupting its continuity weakens the printed circuit board. Providing multiple channels per contact surface simultaneously distributes the heat more uniformly on the printed circuit board, which in turn counteracts the formation of temperature peaks, and thus the accompanying stresses and consequently weakening of the printed circuit board.

In the same way, it can preferably be provided that the conducting layer be structured into multiple contact surfaces for an electronic component to be populated on the printed circuit board and that at least one channel passing through the contact surface and the insulating layer be produced for at least one of the contact surfaces.

According to a preferred embodiment of this invention, the at least one channel extends beyond the area of the contact surface. Now whether the contact surface is dimensioned as a simple contact surface and therefore essentially with the area that corresponds to the contacts of the component to be populated, or whether the contact surface is designed in the form of a heat spreading surface, i.e., with an area that is substantially larger than what would be necessary for the component to be populated or make contact, in both cases the above-described inventive channels can be dimensioned, in particular they can have such a horizontal extension, i.e., such an extension in the plane of the printed circuit board, that the channel extends beyond the area of the contact surface or the heat spreading surface, and therefore the heat of the component can be conducted as far away from the component as is desired, as long as the channel which is, as a rule filled with metal, as was mentioned above, does not cross any conductor tracks and above all does not cause any short circuits of any conductor tracks of the printed circuit board.

According to a preferred embodiment of this invention, the solder deposit consists of SAC solder. Filling the channel passing through the contact surface and the insulating layer with a solder is advantageous since in this case populating the component on the printed circuit board, which is, as a rule, done by soldering, can be done in a common process step with filling the at least one channel. SAC solder, which is a solder containing the components tin, silver, and copper, has turned out to be especially advantageous for soldering and simultaneously is especially thermally conductive.

The invention is explained in detail below using a sample embodiment that is schematically illustrated in the drawing. The figures in the drawing are as follows:

FIG. 1*a* is a schematic top view of an intermediate in the production of an inventive printed circuit board;

FIG. 1*b* is a cross section through the mentioned intermediate along the dot-dash line of FIG. 1*a*;

Figure 1:
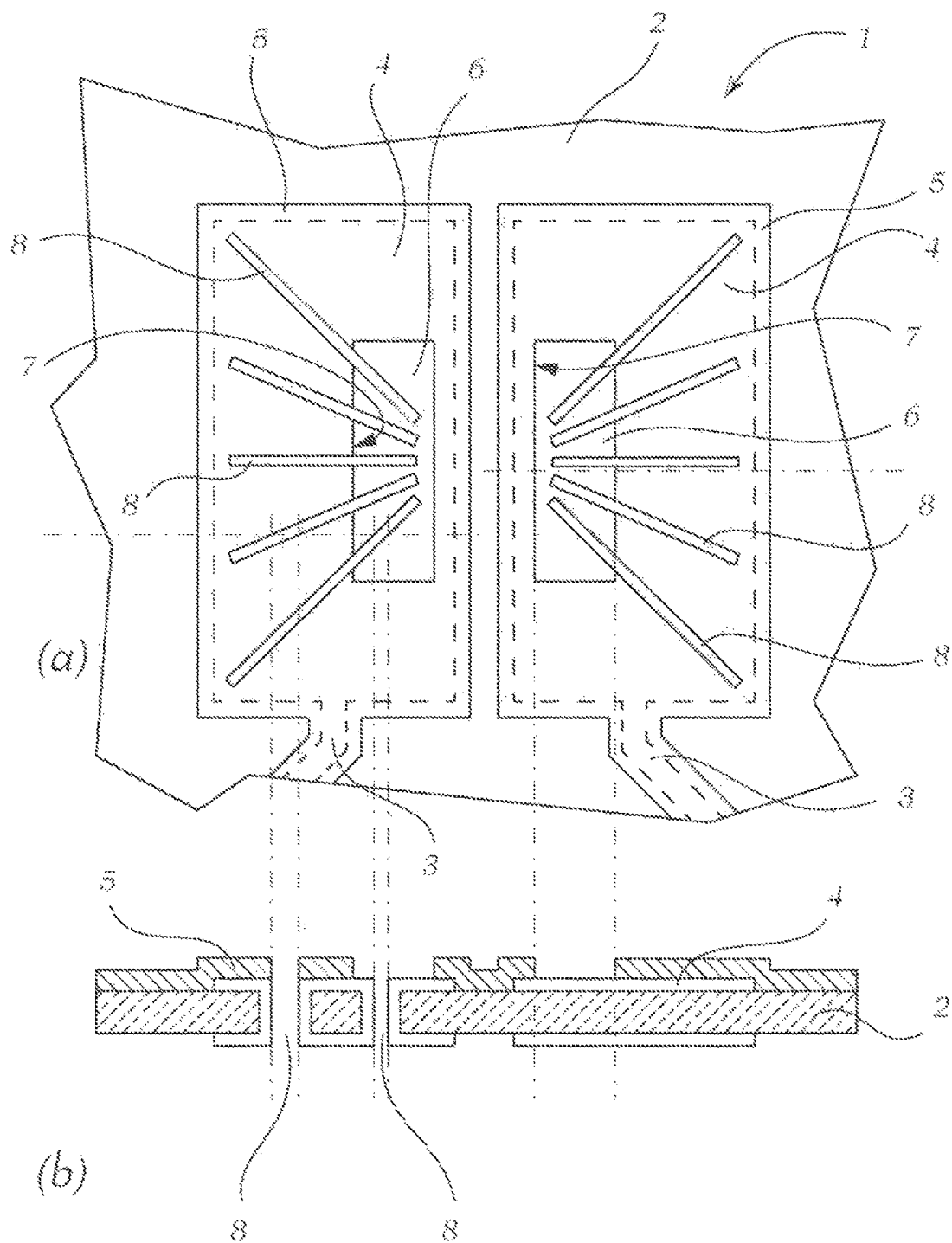

FIG. 1*a* shows an inventive printed circuit board designated with the reference number 1. The printed circuit board consists essentially of an insulating layer 2 and a conducting layer 3, which is structured into conductor tracks and contact surfaces 4 for a component to be populated on the printed circuit board. The contact surfaces 4 are shown in FIG. 1*a* with dashed lines, since the edges of their outlines are hidden under solder resist 5, and the only parts of the contact surfaces 4 that are directly visible are the contact zones 6 necessary to make contact. Therefore, in FIG. 1a the contact surfaces 4 for the component to be populated are in the form of heat spreading surfaces, since their area is substantially larger than the area that would be necessary merely for the component to make electrical contact. The solder resist 5 is applied, leaving a recess 7 free of the solder resist 5, to leave the contact surfaces 6 free to contact the component. The channels passing through the contact surface 4 and the insulating layer 2 are labeled with the reference number 8 and are can be produced with processes described above.

FIG. 1b reproduces the situation of FIG. 1a in cross-section, and it can be seen that the contact surface 4 passes along the channels 8 to the other side of the insulating layer 2, where it is symmetrically arranged. The channels 8 pass through both the contact surface 4 and also the insulating layer 2, and in FIGS. 1a and 1b they are not yet filled with the thermally conductive material, in particular the metal, as was already mentioned.

Figure 2:
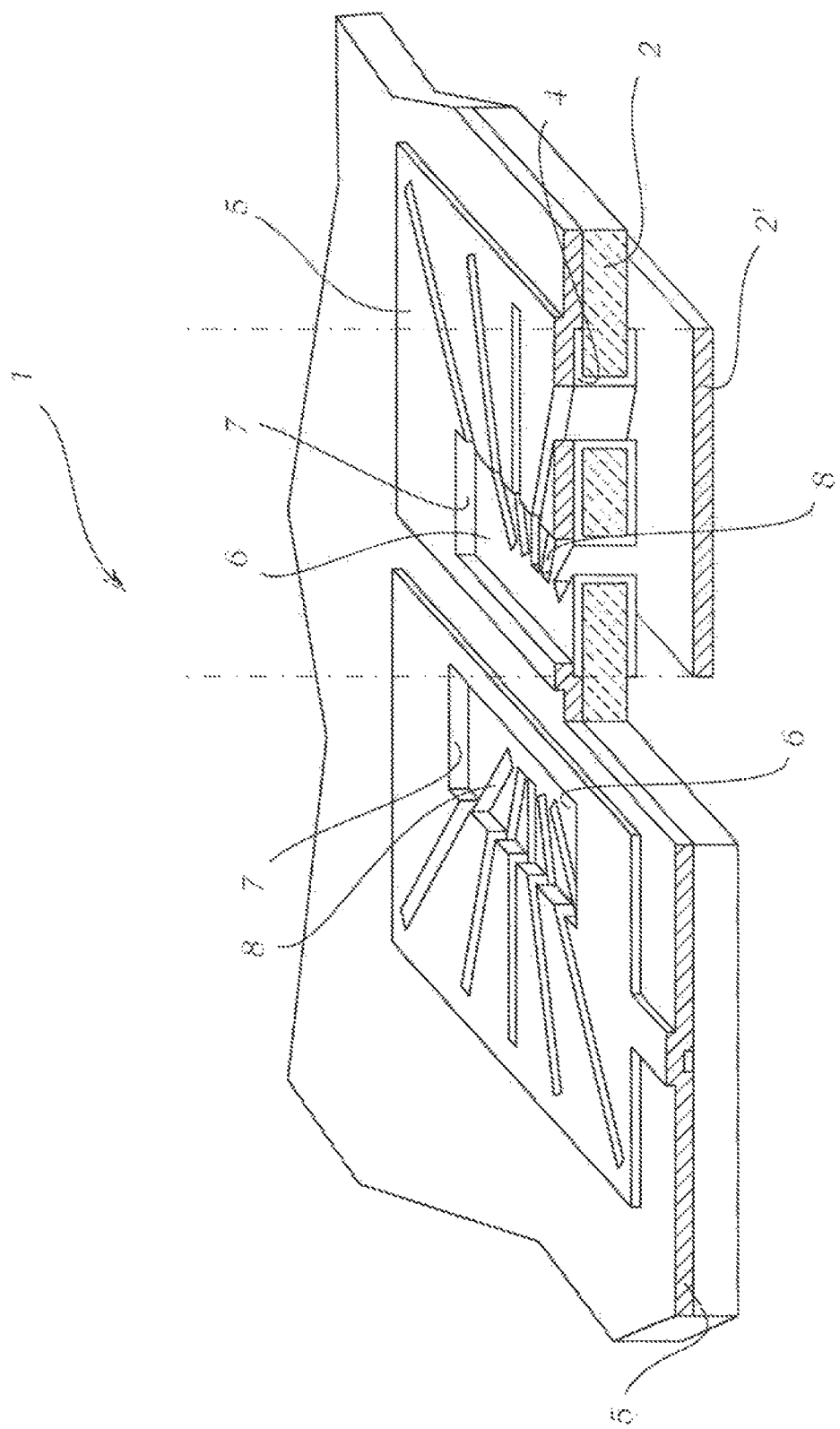
FIG. 2 is a perspective, partly sectional view, through an intermediate according to FIGS. 1*a* and 1*b*.

In FIG. 2 it can once again be seen that in this intermediate the insulating layer 2 and the contact surface 4 lying above it are covered by solder resist 5, which however already is penetrated to form the channels 8, as are the contact surface 4 and the insulating layer 2. Reference number 2' designates an insulating layer that can be applied to the inventive sandwich printed circuit board as an additional insulating layer to close the channels 8 on the side opposite the component.

Figure 3:
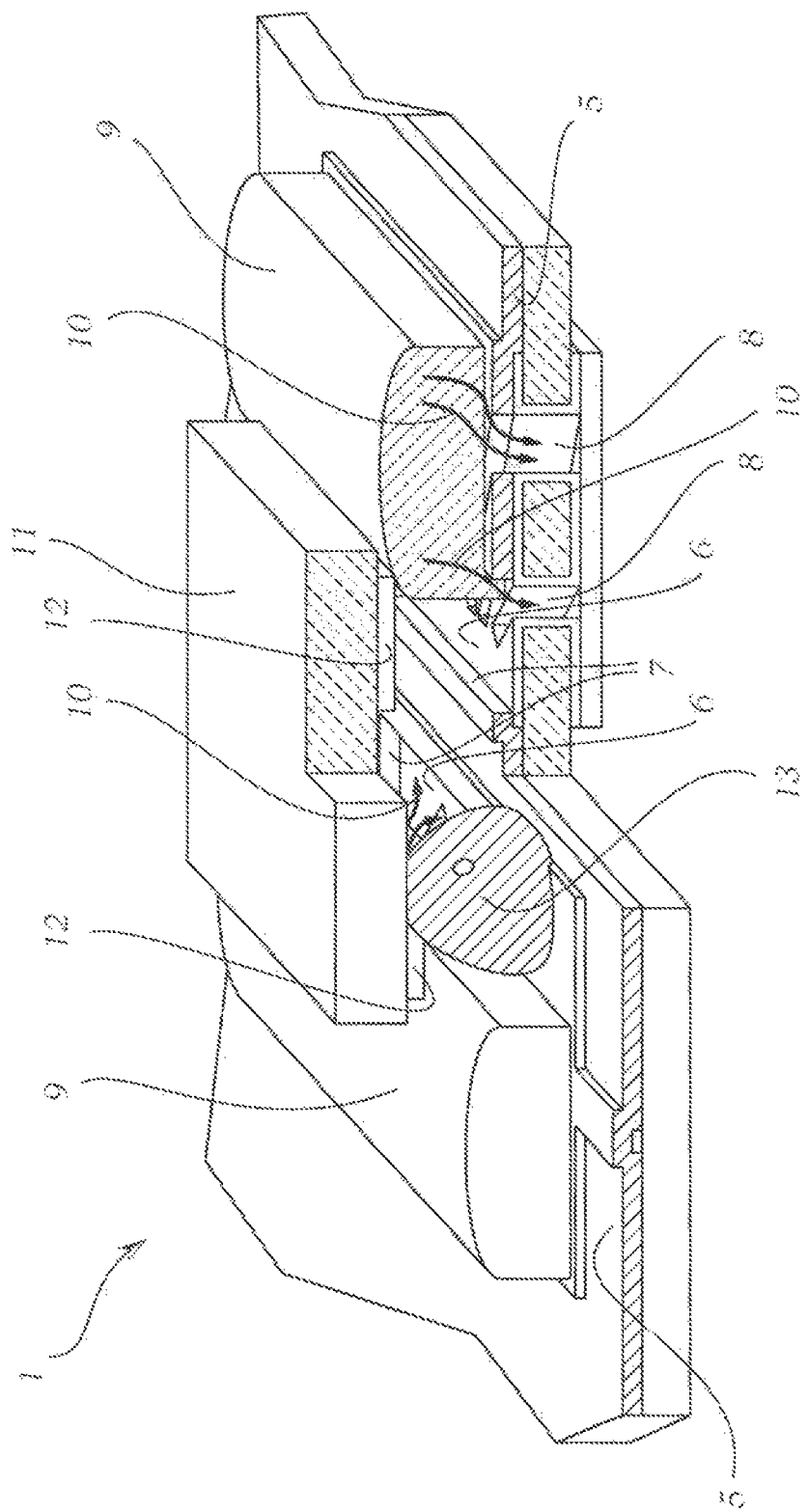
FIG. 3 is an intermediate in the production of an inventive printed circuit board, which already has the solder deposit and a component on it.

In FIG. 3, solder deposits 9 are now provided on the solder resist 5 next to the recess 7, arrows 10 indicating that if the temperature is correspondingly increased and thus the solder deposits 9 melt, the liquefied solder flows into die channels 8 and into the contact zone 6. Before the solder melts, the electronic component 11 lies on the solder deposits 9, and is temporarily held by an adhesive dot 13. When the solder deposit 9 melts, this solidly holds the component 11 in its vertical and horizontal position with respect to the printed circuit board 1, so that the electronic component 11 does not sink or float. It is ensured that the solder from the solder deposit 9 makes contact with the contact pads 12 of the electronic component 11 by the fact that the print layout of the printed circuit board 1 provides an at least minimum overlap between the solder deposit 9 and the contact zones 6 on the printed circuit board 1 and the contact pads 12 of the electronic component 11, and that the distance between the contact pads 10 and the contact zone 6 of the contact surfaces 4 is relatively small, so that there is capillary action between the contact pads 12 and the contact zone 6, and the solder from the solder deposit 9 is pulled up to the contact pads in these areas.

Figure 4:
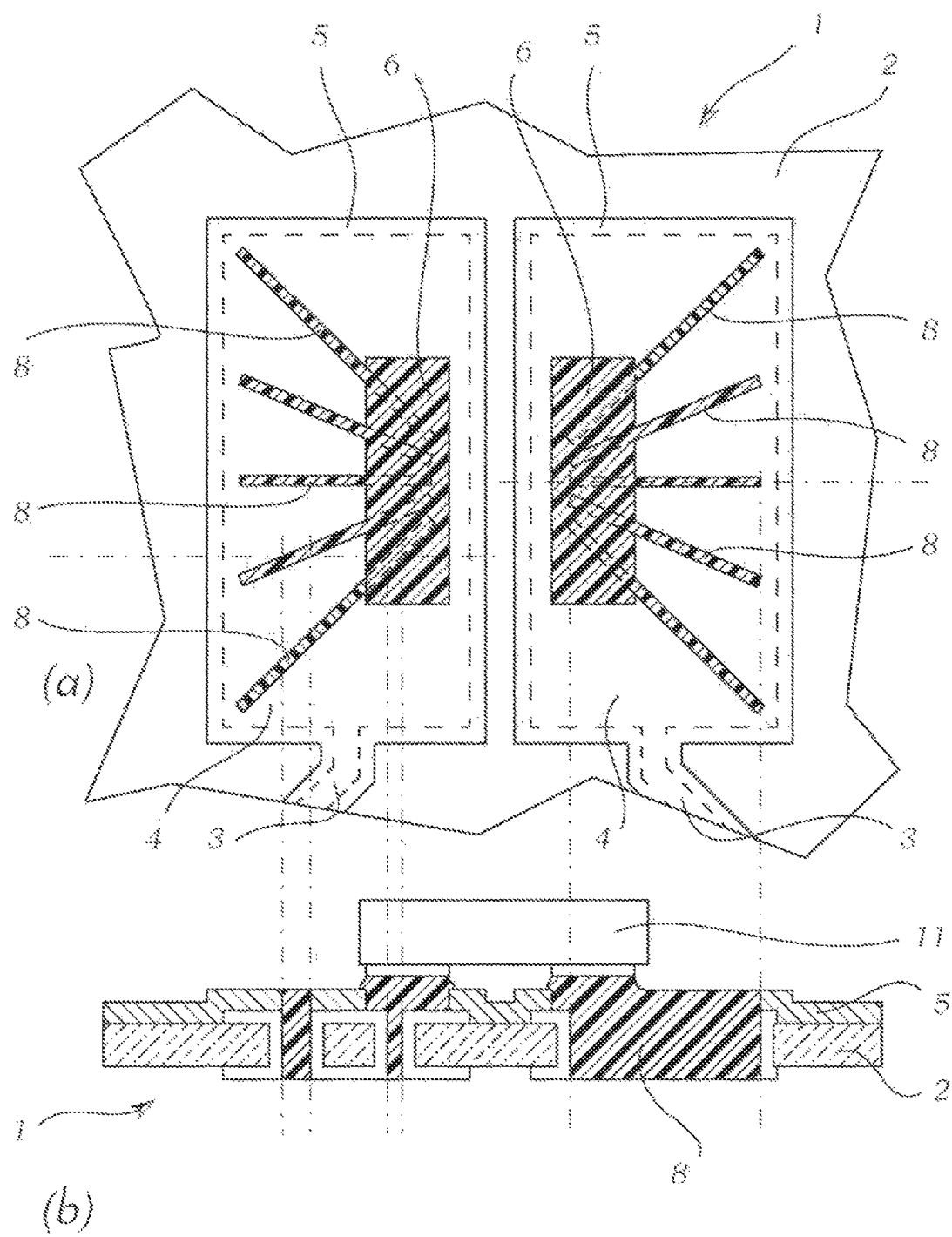
FIGS. 4*a* and 4*b* are a top view after the solder has melted and a section after the solder has melted, respectively.

FIG. 4a shows the situation of the printed circuit board after the solder melts, however omits the electronic component 11 to provide a better top view of the channels 8. In FIG. 4a it can be seen that both the channels 8 and also the contact zones 6 are completely filled with solder, and therefore the heat given off by the component 11 can be distributed over the entire area of the contact surface 4 for the component 11 to be populated, this contact surface 4 being in the form of a heat spreading surface, while especially FIG. 4b shows that a large volume of metal, and therefore a large mass of metal, can be provided in the channels 8, so that the heat absorbed from the component 11 can be dissipated in this mass of metal, in particular it can also be conducted to the other side of the printed circuit board 1. This allows even large quantities of heat from electronic components such as LEDs to be distributed and conducted away, so that the inventive printed circuit board generally produces a smaller point load on the printed circuit board itself and also the component 11, which is very beneficial for giving the printed circuit board a longer service life and operationally reliability.

The invention claimed is:

1. A printed circuit board (1) comprising:
an insulating layer (2) and a conducting layer (3) arranged on the insulating layer (2) and structured into a contact surface (4) for an electronic component (11) which is to be populated on the printed circuit board (1),
wherein the printed circuit board (1) has, in an area of the contact surface (4), at least one channel (8) that passes through the contact surface (4) and the insulating layer (2) and that is filled with a thermally conductive material,
wherein the at least one channel comprises an opening in the printed circuit board that has, in contrast to a simple drill hole or a shaft, a substantial horizontal extension in a plane of the printed circuit board.

2. The printed circuit board of claim 1, wherein the at least one channel (8) comprises multiple spaced apart channels, and wherein the multiple spaced apart channels (8) pass through the contact surface (4) and the insulating layer (2), in the area of the contact surface (4), and are filled with the thermally conductive material.

3. The printed circuit board of claim 1, wherein the contact surface (4) goes along the at least one channel (8) from one side of the insulating layer (2) to its other side.

4. The printed circuit board of claim 1, wherein the contact surface comprises multiple contact surfaces, wherein the conducting layer (3) is structured into the multiple contact surfaces (4) for the electronic component (11) which are to be populated on the printed circuit board (1), and wherein the at least one channel (8) passing through the at least one contact surface (4) of the multiple contact surfaces and the insulating layer (2).

5. The printed circuit board of claim 1, wherein the contact surface (4) is in the form of a heat spreading surface.

6. The printed circuit board of claim 1, wherein the at least one channel (8) extends beyond the contact surface (4).

7. The printed circuit board of claim 1, wherein the thermally conductive material is selected from the group consisting of a solder, silver nanopaste, thermal adhesive, and thermal interface material.

8. The printed circuit board of claim 1, wherein the printed circuit board (1) comprises multiple insulating layers (2, 2') and conducting layers (3) arranged on top of one another in alternation.

9. The printed circuit board of claim 1, wherein the at least one channel (8) is closed with the insulating layer (2') on one side of the printed circuit board (1).

10. The printed circuit board of claim 1, wherein the at least one channel (8) is lined with the thermally conductive material.

11. The printed circuit board of claim 10, wherein the metallic material is copper.

12. The printed circuit board of claim 1, wherein solder resist is applied to the printed circuit board (1), and wherein the contact surface (4) comprises a contact zone (6) that is left free and serves to contact the electronic component (11), the at least one channel (8), and the contact zone (6).

13. The printed circuit board of claim 1, wherein the printed circuit board (1) is populated with an electronic component (11), and wherein the electronic component (11) is electrically connected with the contact surface (4) of the printed circuit board (1).

14. The printed circuit board of claim 1, wherein the thermally conductive material is SAC solder.

15. A production process for a printed circuit board, comprising:
   preparing an insulating layer (2) and a conducting layer (3) connected with the insulating layer (2);
   producing at least one channel (8) passing through the conducting layer (3) and the insulating layer (2), wherein the at least one channel comprises an opening in the printed circuit board that has, in contrast to a simple drill hole or a shaft, a substantial horizontal extension in a plane of the printed circuit board;
   lining the at least one channel (8) with a thermally conductive material by electroplating;
   structuring the conducting layer (3) into at least one contact surface for an electronic component (11) to be populated on the printed circuit board;
   preparing a solder deposit (9) on the conducting layer (3), the solder deposit (9) at least overlapping with the at least one contact surface (4);
   setting the electronic component (11) on the at least one contact surface (4); and
   melting and then cooling the solder deposit (9) in a manner effective to electrically and mechanically connect the electronic component (11) with the at least one contact surface (4).

16. The process of claim 15, wherein the step of preparing the solder deposit (9) is preceded by applying a solder resist to the printed circuit board (1), the at least one contact surface (4) comprising a contact zone (6) that serves to contact the electronic component (11) and that is arranged so that it overlaps with the solder deposit (9) to be put on thereafter, the at least one channel (8) and the contact zone (6) being left free.

17. The process of claim 15, wherein the step of preparing the solder deposit is preceded by filling the at least one channel (8) with the thermally conductive material.

18. The process of claim 17, wherein the thermally conductive material is SAC solder.

19. The process of claim 15, wherein the at least one channel comprises multiple spaced apart channels (8) that pass through the at least one contact surface (4) and the insulating layer (2).

20. The process of claim 15, wherein the at least one contact surface comprises multiple contract surfaces, wherein the conducting layer (3) is structured into the multiple contact surfaces (4) for the electronic component (11) which is to be populated on the printed circuit board (1), and wherein the at least one channel (8) passes through at least one of the multiple contact surfaces and the insulating layer.

21. The process of claim 15, wherein the at least one channel (8) extends beyond an area of the at least one contact surface (4).

22. The process of claim 15, wherein the solder deposit (9) consists of SAC solder.

* * * * *